(12) United States Patent
Kim

(10) Patent No.: US 7,180,800 B2
(45) Date of Patent: Feb. 20, 2007

(54) INTERFACE CIRCUIT FOR ADAPTIVELY LATCHING DATA INPUT/OUTPUT SIGNAL BY MONITORING DATA STROBE SIGNAL AND MEMORY SYSTEM INCLUDING THE INTERFACE CIRCUIT

(75) Inventor: Sog-won Kim, Yongin-si (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 11/228,609

(22) Filed: Sep. 16, 2005

(65) Prior Publication Data
US 2006/0087894 A1    Apr. 27, 2006

(30) Foreign Application Priority Data
Oct. 27, 2004    (KR) ...................... 10-2004-0086131

(51) Int. Cl.
*G11C 7/00*    (2006.01)
(52) U.S. Cl. .................. 365/193; 365/194; 365/233
(58) Field of Classification Search ................ 365/193, 365/194, 233, 189.05, 230.08, 189.08, 189.02
See application file for complete search history.

(56) References Cited

U.S. PATENT DOCUMENTS

| | | | |
|---|---|---|---|
| 5,896,347 A | 4/1999 | Tomita et al. .............. 365/233 |
| 6,397,312 B1 | 5/2002 | Nakano et al. ............. 711/167 |
| 6,671,211 B2 * | 12/2003 | Borkenhagen et al. .. 365/189.05 |
| 6,728,162 B2 | 4/2004 | Lee et al. .................... 365/233 |
| 2002/0149967 A1 * | 10/2002 | Borkenhagen et al. .. 365/189.05 |
| 2004/0071015 A1 * | 4/2004 | Borkenhagen et al. .. 365/189.05 |
| 2005/0156647 A1 * | 7/2005 | Kim .......................... 327/276 |

* cited by examiner

*Primary Examiner*—Anh Phung
*Assistant Examiner*—Hien N Nguyen
(74) *Attorney, Agent, or Firm*—Mills & Onello LLP

(57) ABSTRACT

In a memory system, a memory device that outputs a data strobe signal and memory cell data according to a read command. A memory controller receives the data strobe signal and latches the memory cell data that is output by the memory device, using an interface circuit that realigns the data strobe signal so that an edge of the data strobe signal is substantially centered on the availability of the memory cell data. The interface circuit includes a logic circuit portion that generates a plurality of selection signals in response to the read command and that outputs data strobe sampling signals in response to the selection signals, and further includes a storage portion that captures an edge of the data strobe signal in response to the data strobe sampling signals and that realigns the data strobe signal. Accordingly, the memory controller adaptively latches the data input/output signal by monitoring the data strobe signal provided by the memory device, without including a delay locked loop (DLL) circuit which has a complicated structure and consumes a large amount of power.

11 Claims, 3 Drawing Sheets

INTERFACE CIRCUIT FOR ADAPTIVELY LATCHING DATA INPUT/OUTPUT SIGNAL BY MONITORING DATA STROBE SIGNAL AND MEMORY SYSTEM INCLUDING THE INTERFACE CIRCUIT

BACKGROUND OF THE INVENTION

This application claims priority to Korean Patent Application No. 10-2004-0086131, filed on Oct. 27, 2004, in the Korean Intellectual Property Office, the disclosure of which is incorporated herein in its entirety by reference.

1. Field of the Invention

The present invention relates to a semiconductor integrated circuit, and more particularly, to an interface circuit for adaptively latching a data input/output signal by monitoring a data strobe signal provided by a memory device, and a memory system including the interface circuit.

2. Description of the Related Art

Memory systems commonly include a memory controller which controls operation of a memory device, such as a synchronous DRAM (SDRAM) device. The SDRAM and the memory controller perform their operations in response to a clock signal. In particular, the memory controller includes a delay locked loop (hereinafter, referred to as DLL) to stably latch data read from the SDRAM. The DLL synchronizes a data strobe signal DQS received from the SDRAM with a phase of data read from the SDRAM.

FIG. 1 is a block diagram of a conventional memory system 100. Referring to FIG. 1, a memory controller 110 and an SDRAM 120 of the memory system 100 are connected to each other through a clock signal CLK, an address signal ADDR, a data strobe signal DQS, a data input/output signal DQ[31:0], and control signals. The SDRAM 120 produces the data strobe signal DQS that has a phase that is shifted with respect to a phase of the clock signal CLK received from the memory controller 110, and provides the data strobe signal DQS to the memory controller 110. The data strobe signal DQS is produced in a delay-locked loop DLL 122 of the SDRAM 120 so as to be output in synchronization with the data input/output signal DQ[31:0]. The data strobe signal DQS is provided to a DLL 112 of the memory controller 110. The DLL 112 controls a phase of the data strobe signal DQS to latch the data input/output signal DQ[31:0] read from the SDRAM 120.

The DLL 122 of the SDRAM 120 locks the clock signal CLK, which is always received from the memory controller 110. However, the DLL 112 of the memory controller 110 locks the data strobe signal DQS, which is generated when the SDRAM 120 reads out the data input/output signal DQ[31:0]. In other words, because the DLL 112 of the memory controller 110 is required to lock the data strobe signal DQS that is arbitrarily generated, the design and implementation of a circuit for monitoring the data strobe signal DQS is not straightforward. Also, because the DLL 112 consumes a large amount of power when operating, it is not optimal for use in a memory controller 110 installed in a mobile electronic device, such as, a cellular phone.

SUMMARY OF THE INVENTION

The present invention provides an interface circuit for a memory controller and a memory system including such a circuit that is capable of locking on a data strobe signal DQS received from a memory device, without the need for a delay locked loop DLL circuit.

The present invention provides a memory system which adaptively latches a data input/output signal by monitoring a data strobe signal provided by a memory device, and a memory system including the interface circuit.

The present invention also provides an interface circuit which adaptively latches data by monitoring a data strobe signal provided by a memory device without including a delay locked loop (DLL) circuit.

In one aspect, the present invention is directed to a memory system. A memory device outputs a data strobe signal and memory cell data according to a read command. A memory controller receives the data strobe signal and latches the memory cell data that is output by the memory device, using an interface circuit that realigns the data strobe signal so that an edge of the data strobe signal is substantially centered on the availability of the memory cell data. The interface circuit includes a logic circuit portion that generates a plurality of selection signals in response to the read command and that outputs data strobe sampling signals in response to the selection signals, and further includes a storage portion that captures an edge of the data strobe signal in response to the data strobe sampling signals and that realigns the data strobe signal.

In one embodiment, the logic circuit portion comprises: a plurality of MUXes each selecting one of a previous data strobe sampling signal and the data strobe signal in response to the selection signals and outputting the selected signal; and flip-flops each outputting a current data strobe sampling signal, which is the signal output by each of the MUXes, in response to a clock signal and feeding the current data strobe sampling signal back to a corresponding one of the MUXes so that the current data strobe sampling signal can serve as the previous data strobe sampling signal.

In another embodiment, the storage portion divides a clock signal and a delayed clock signal, which is obtained by delaying the clock signal for a predetermined period of time, into a plurality of regions in each of which states of the clock signal and the delayed clock signal remain constant.

In another embodiment, the storage portion detects in which region of the regions a first rising edge of the data strobe signal occurs.

In another embodiment, the storage portion is controlled by a finite state machine (FSM).

In another aspect, the present invention is directed to an interface circuit for receiving a data strobe signal and output data provided by a memory device, the interface circuit comprising: a clock delay portion that receives a clock signal and that produces a delayed clock signal based on the clock signal; a selection signal generating portion that generates first through N-th (where N denotes a natural number) selection signals in response to a read command of the memory device; first through N-th MUXes each selecting one of a previous data strobe sampling signal and the data strobe signal in response to each of the first through N-th selection signals and outputting the selected signal; a first group of flip-flops each outputting a current data strobe sampling signal, which is the signal output by each of the first through N/2-th MUXes, in response to the clock signal and feeding the current data strobe sampling signal back to each of the first through N/2-th MUXes so that the current data strobe sampling signal can serve as the previous data strobe sampling signal of each of the first through N/2-th MUXes; and a second group of flip-flops each outputting a current data strobe sampling signal, which is the signal output by each of the (N/2+1)th through N-th MUXes, in response to the delayed clock signal and feeding the current data strobe sampling signal back to each of the (N/2+1)th through N-th MUXes so that the current data strobe sampling signal can serve as the previous data strobe sampling signal of each of the (N/2+1)th through N-th MUXes.

In one embodiment, the interface circuit is provided in a memory controller connected with the memory device.

In another embodiment, different edges of the data strobe signal are captured depending on the data strobe sampling signals, and the data strobe signal is recognized so that the edges of the data strobe signal are centered on the output data of the memory device.

In another embodiment, the interface circuit further comprises a storage portion that divides the clock signal and the delayed clock signal into a plurality of regions in each of which states of the clock signal and the delayed clock signal remain constant.

In another embodiment, the region of the region in which a first rising edge of the data strobe signal of the memory device enters is detected.

In another embodiment, the data strobe signal is realigned so that edges of the recognized data strobe signal are substantially centered on the availability output data of the memory device.

Accordingly, the memory controller adaptively latches the data input/output signal by monitoring the data strobe signal provided by the memory device, without including a delay locked loop (DLL) circuit which has a complicated structure and consumes a large amount of power. The data strobe signal recognized by the interface circuit is approximately or substantially centered on sections of the data input/output signals, thereby widening an effective window of data and enlarging a signal margin TDQSQ from an edge of the data strobe signal to an edge of the data input/output signal.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
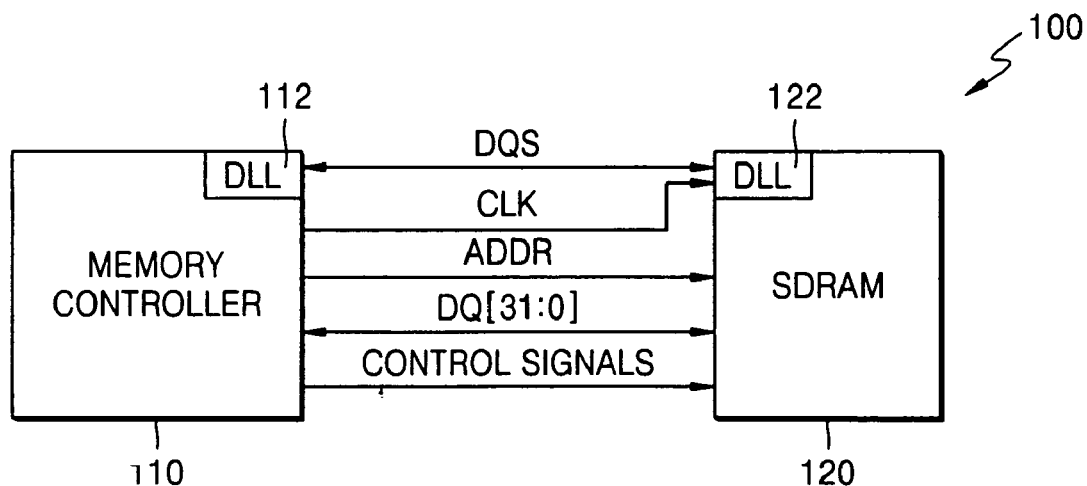
FIG. 1 is a block diagram of a conventional memory system.

The attached drawings for illustrating embodiments of the present invention are referred to in order to gain an understanding of the present invention, the merits thereof, and the objectives accomplished by the implementation of the present invention. Hereinafter, the present invention will be described in detail by explaining preferred embodiments of the invention with reference to the attached drawings. Like reference numerals in the drawings denote like elements.

Figure 2:
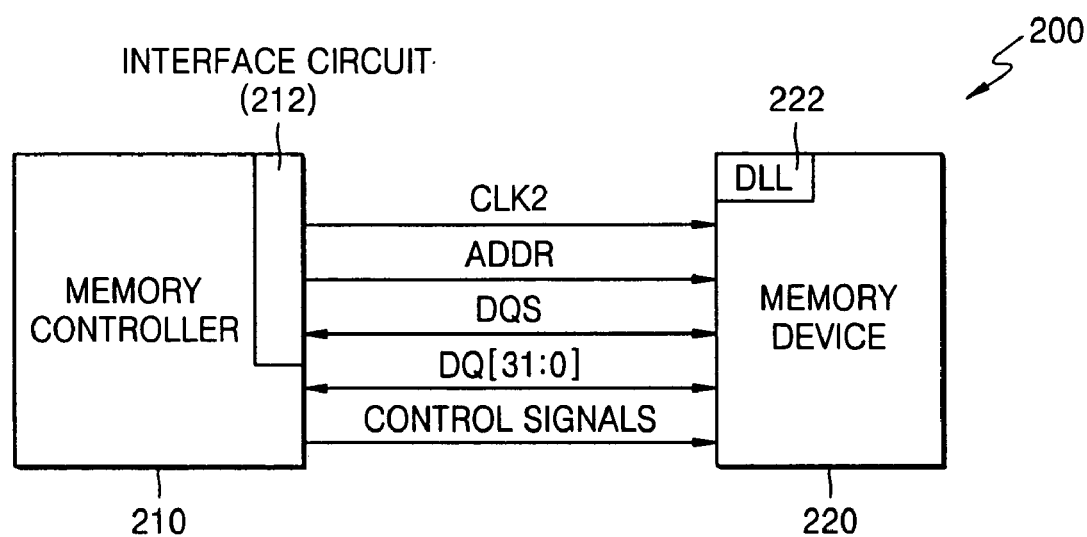
FIG. 2 is a block diagram of a memory system according to an embodiment of the present invention, including a memory controller in which an interface circuit is provided.

FIG. 2 is a block diagram of a memory system 200 including a memory controller 210 in which an interface circuit 212 is provided, according to an embodiment of the present invention. In the memory system 200, the interface circuit 212 is provided in the memory controller 210. The interface circuit 212 does not include delay locked loop (DLL) circuitry. The memory controller 210 is connected to a memory device 220, for example, an SDRAM, via a second clock signal CLK2, an address signal ADDR, a data strobe signal DQS, a data input/output signal DQ[31:0], and control signals.

Figure 3:
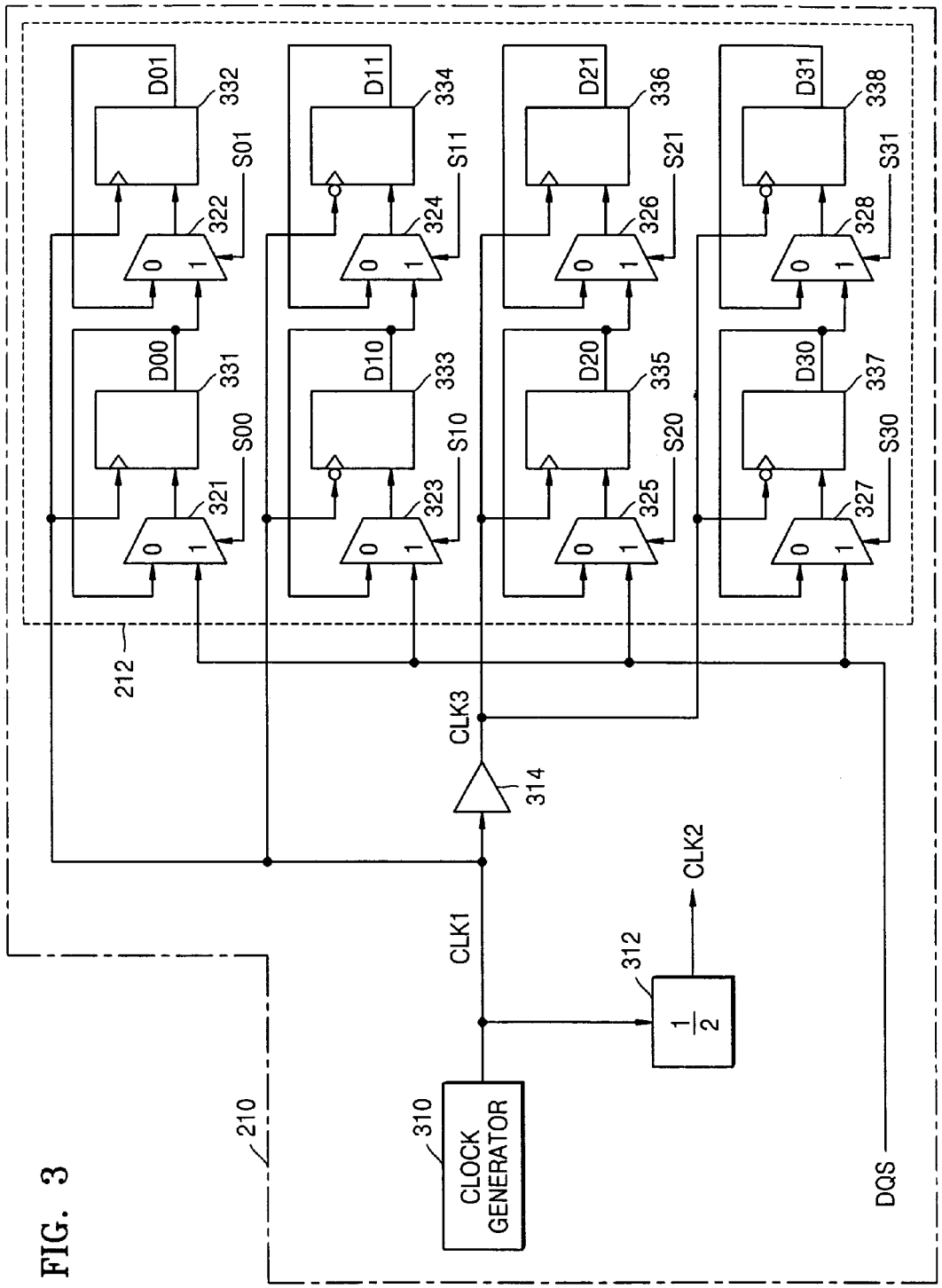
FIG. 3 is a circuit diagram of the memory controller of FIG. 2, in accordance with the present invention.

FIG. 3 is detailed a circuit diagram of the memory controller 210, that includes the interface circuit 212. Referring to FIG. 3, the memory controller 210 includes a clock generator 310, a ½ frequency divider 312, a delay unit 314, and the interface circuit 212. A first clock signal CLK1 generated by the clock generator 310 is provided to the ½ frequency divider 312 and the delay unit 314 to produce the second clock signal CLK2 and a third clock signal CLK3, respectively. The second clock signal CLK2 is provided to the memory device 220 of FIG. 2.

The interface circuit 212 receives the first clock signal CLK1 from the clock generator 310, the third clock signal CLK3 from the delay unit 314, and the data strobe signal DQS from the memory device 220. The interface circuit 212 includes multiplexers (MUXes) 321 through 328 and flip-flops 331 through 338, which produce data strobe sampling signals D00, D01, D10, D11, D20, D21, D30, and D31 in response to first through eighth selection signals S00, S01, S10, S11, S20, S21, S30, and S31. Although this embodiment includes the 8 MUXes 321 through 328 and the 8 flip-flops 331 through 338, it is apparent to one of ordinary skill in the art that the numbers of MUXes and flip-flops can vary. For example, an increase in the number of MUXes and flip-flops would result in increased precision in locking onto the DQS signal. The first through eighth selection signals S00, S01, S10, S11, S20, S21, S30, and S31 are produced in response to a read command of the memory device 220.

The first MUX 321 selects either a previous first data strobe sampling signal D00 or the data strobe signal DQS in response to the first selection signal S00 and outputs the selected signal. The first flip-flop 331 outputs a current first data strobe sampling signal D00, which is either the previous first data strobe sampling signal D00 or the data strobe signal DQS output by the first MUX 321, in response to the first clock signal CLK1. The second MUX 322 selects either the current first data strobe sampling signal D00 or a previous second data strobe sampling signal D01 in response to the second selection signal S01 and outputs the selected signal. The second flip-flop 332 outputs a current second data strobe sampling signal D01, which is either the current first data strobe sampling signal D00 or the previous second data strobe sampling signal D01 output by the second MUX 322, in response to the first clock signal CLK1.

The third MUX 323 selects either a previous third data strobe sampling signal D10 or the data strobe signal DQS in response to the third selection signal S10 and outputs the selected signal. The third flip-flop 333 outputs a current third data strobe. sampling signal D10, which is either the previous third data strobe sampling signal D10 or the data strobe signal DQS output by the third MUX 323, in response to an inverted signal of the first clock signal CLK1. The fourth MUX 324 selects either the current third data strobe sampling signal D10 or a previous fourth data strobe sampling signal D11 in response to the fourth selection signal S11 and outputs the selected signal. The fourth flip-flop 334 outputs a current fourth data strobe sampling signal D11, which is either the current third data strobe sampling signal D10 or the previous fourth data strobe sampling signal D11 output by the fourth MUX 324, in response to the inverted signal of the first clock signal CLK1.

The fifth MUX 325 selects either a previous fifth data strobe sampling signal D20 or the data strobe signal DQS in response to the fifth selection signal S20 and outputs the selected signal. The fifth flip-flop 335 outputs a current fifth data strobe sampling signal D20, which is either the previous fifth data strobe sampling signal D20 or the data strobe signal DQS output by the fifth MUX 325, in response to the third clock signal CLK3. The sixth MUX 326 selects either the current fifth data strobe sampling signal D20 or a previous sixth data strobe sampling signal D21 in response to the sixth selection signal S21 and outputs the selected signal. The sixth flip-flop 336 outputs a current sixth data strobe sampling signal D21, which is either the current fifth data strobe sampling signal D20 or the previous sixth data strobe sampling signal D21 output by the sixth MUX 326, in response to the third clock signal CLK3.

The seventh MUX 327 selects either a previous seventh data strobe sampling signal D30 or the data strobe signal DQS in response to the seventh selection signal S30 and outputs the selected signal. The seventh flip-flop 337 outputs a current seventh data strobe sampling signal D30, which is either the previous seventh data strobe sampling signal D30 or the data strobe signal DQS output by the seventh MUX 327, in response to an inverted signal of the third clock signal CLK3. The eighth MUX 328 selects either the current seventh data strobe sampling signal D30 or a previous eighth data strobe sampling signal D31 in response to the eighth selection signal S31 and outputs the selected signal. The eighth flip-flop 338 outputs a current eighth data strobe sampling signal D31, which is either the current seventh data strobe sampling signal D30 or the previous eighth data strobe sampling signal D31 output by the eighth MUX 328, in response to the inverted signal of the third clock signal CLK3.

An operation of detecting a first rising edge of the data strobe signal DQS depending on states of the first through eighth data strobe sampling signals D00, D01, D10, D11, D20, D21, D30, and D31 output by the interface circuit 212 is summarized in Table 1.

TABLE 1

|  | D00 | D20 | D10 | D30 | D01 | D21 | D11 | D31 | Capture of edge |
|---|---|---|---|---|---|---|---|---|---|
| Case 1 | 0 | 1 | x | x | x | x | x | x | Edge 0 |
| Case 2 | 0 | 0 | 1 | x | x | x | x | x | Edge 1 |
| Case 3 | 0 | 0 | 0 | 1 | x | x | x | x | Edge 2 |
| Case 4 | 0 | 0 | 0 | 0 | 1 | x | x | x | Edge 3 |
| Case 5 | 0 | 0 | 0 | 0 | 0 | 1 | x | x | Edge 4 |
| Case 6 | 0 | 0 | 0 | 0 | 0 | 0 | 1 | x | Edge 5 |
| Case 7 | 0 | 0 | 0 | 0 | 0 | 0 | 0 | 1 | Edge 6 |
| Case 8 | 0 | 0 | 0 | 0 | 0 | 0 | 0 | 0 | Edge 7 |

In other words, when a first rising edge of the data strobe signal DQS is detected in a region corresponding to case 1, the data strobe signal DQS is set to be recognized at edge 0 due to a variation between data of the first data strobe sampling signal D00 and the fifth data strobe sampling signal D20. When the first rising edge of the data strobe signal DQS is detected in a region corresponding to case 2, the data strobe signal DQS is set to be recognized at edge 1 due to a variation between data of the fifth and third data strobe sampling signals D20 and D10. In the same manner, when the first rising edge of the data strobe signal DQS is detected in a region corresponding to case 8, the data strobe signal DQS is set to be recognized at edge 7.

A finite state machine (FSM) can be used to control the operation of the interface circuit 212 of the memory controller 210 according to Table 1, and in accordance with the timing diagram discussed below with reference to FIG. 4.

Figure 4:
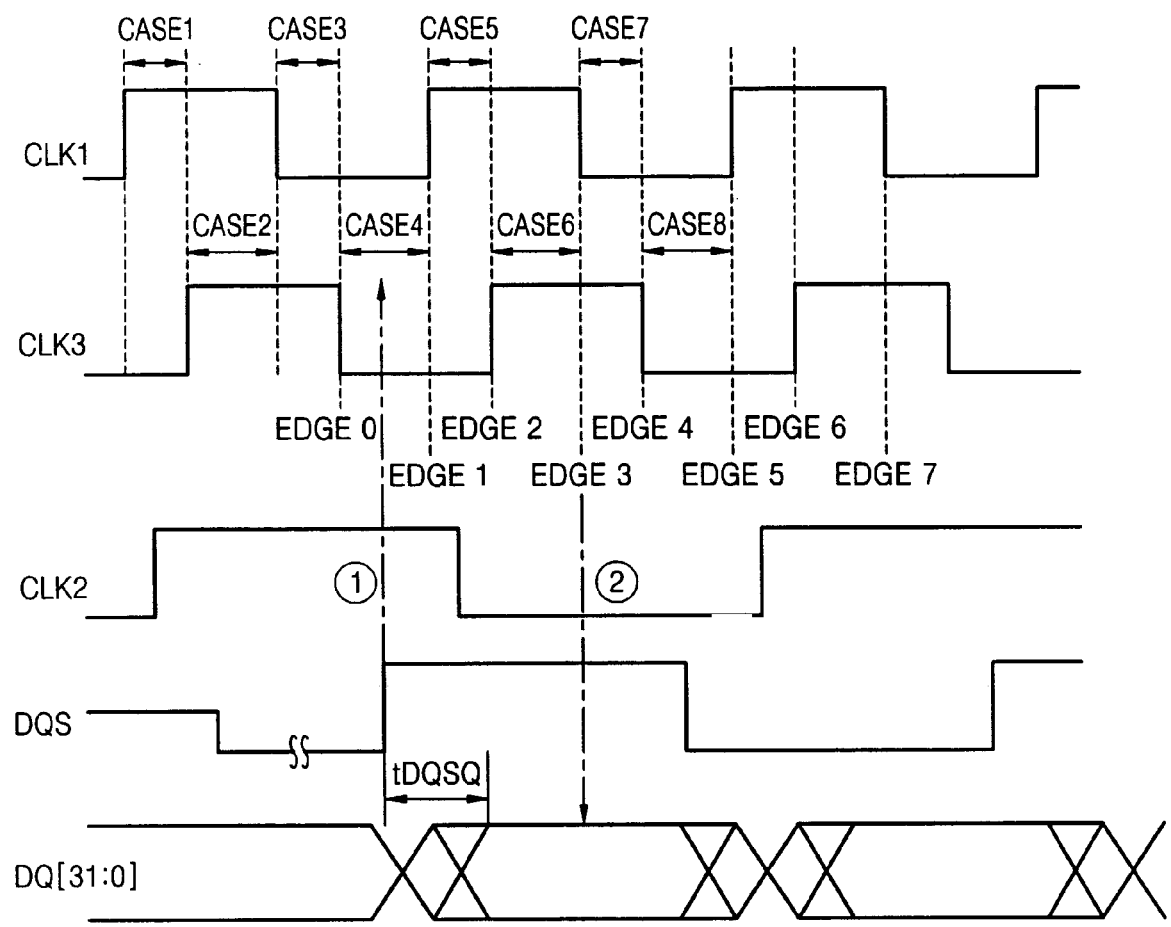
FIG. 4 is a timing diagram for illustrating an operation of the memory controller of FIG. 3, in accordance with the present invention.

FIG. 4 is a timing diagram illustrating an operation of the interface circuit 212. Referring to FIG. 4, the third clock signal CLK3 is generated by delaying the first clock signal CLK1 for a predetermined period of time. In one embodiment, the delay time applied by the delay unit 314 is an amount of time that is less than the period of the first clock signal CLK1, for example, the delay time is less than half the period of the first clock signal CLK1. The second clock signal CLK2 is generated by dividing a frequency of the first clock signal CLK1 by 2. The first and third clock signals CLK1 and CLK3 are divided into regions of first through eighth portions (case 1 through case 8) in each of which states of the first and third clock signals CLK1 and CLK3 remain constant. When the first rising edge of the data strobe signal DQS received from the memory device 220 of FIG. 2 is received during a region corresponding to case 4 (see ①), the data strobe signal DQS is set to be recognized at edge 3 due to the variation between data of the seventh and second data strobe sampling signals D30 and D01 (see ②). The data strobe signal DQS recognized in this way is centered on sections of the data input/output signals DQ[31:0], thereby widening an effective window of data and enlarging a signal margin tDQSQ from an edge of the data strobe signal DQS to an edge of the data input/output signal DQ[31:0].

The above approach further recognizes a rising edge of the data strobe signal DQS received during other regions corresponding to other cases of case 1 through case 8, and ensures centering of the data strobe signal DQS with respect to the data input/output signals DQ[31:0}.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. A memory system comprising:
    a memory device that outputs a data strobe signal and memory cell data according to a read command; and
    a memory controller that receives the data strobe signal and that latches the memory cell data that is output by the memory device, using an interface circuit that realigns the data strobe signal so that an edge of the data strobe signal is substantially centered on the availability of the memory cell data,
    wherein the interface circuit comprises:
        a logic circuit portion that generates a plurality of selection signals in response to the read command and that outputs data strobe sampling signals in response to the selection signals; and
        a storage portion that captures an edge of the data strobe signal in response to the data strobe sampling signals and that realigns the data strobe signal.

2. The memory system of claim 1, wherein the logic circuit portion comprises:
    a plurality of MUXes each selecting one of a previous data strobe sampling signal and the data strobe signal in response to the selection signals and outputting the selected signal; and flip-flops each outputting a current data strobe sampling signal, which is the signal output by each of the MUXes, in response to a clock signal and feeding the current data strobe sampling signal back to a corresponding one of the MUXes so that the current data strobe sampling signal can serve as the previous data strobe sampling signal.

3. The memory system of claim 1, wherein the storage portion divides a clock signal and a delayed clock signal, which is obtained by delaying the clock signal for a predetermined period of time, into a plurality of regions in each of which states of the clock signal and the delayed clock signal remain constant.

4. The memory system of claim 3, wherein the storage portion detects in which region of the regions a first rising edge of the data strobe signal occurs.

5. The memory system of claim 1 wherein the storage portion is controlled by a finite state machine (FSM).

6. An interface circuit for receiving a data strobe signal and output data provided by a memory device, the interface circuit comprising:
   a clock delay portion that receives a clock signal and that produces a delayed clock signal based on the clock signal;
   a selection signal generating portion that generates first through N-th (where N denotes a natural number) selection signals in response to a read command of the memory device;
   first through N-th MUXes each selecting one of a previous data strobe sampling signal and the data strobe signal in response to each of the first through N-th selection signals and outputting the selected signal;
   a first group of flip-flops each outputting a current data strobe sampling signal, which is the signal output by each of the first through N/2-th MUXes, in response to the clock signal and feeding the current data strobe sampling signal back to each of the first through N/2-th MUXes so that the current data strobe sampling signal can serve as the previous data strobe sampling signal of each of the first through N/2-th MUXes; and
   a second group of flip-flops each outputting a current data strobe sampling signal, which is the signal output by each of the (N/2+1)th through N-th MUXes, in response to the delayed clock signal and feeding the current data strobe sampling signal back to each of the (N/2+1)th through N-th MUXes so that the current data strobe sampling signal can serve as the previous data strobe sampling signal of each of the (N/2+1)th through N-th MUXes.

7. The interface circuit of claim 6, wherein the interface circuit is provided in a memory controller connected with the memory device.

8. The interface circuit of claim 6, wherein different edges of the data strobe signal are captured depending on the data strobe sampling signals, and wherein the data strobe signal is recognized so that the edges of the data strobe signal are centered on the output data of the memory device.

9. The interface circuit of claim 6, further comprising a storage portion that divides the clock signal and the delayed clock signal into a plurality of regions in each of which states of the clock signal and the delayed clock signal remain constant.

10. The interface circuit of claim 9, wherein the region of the region in which a first rising edge of the data strobe signal of the memory device occurs is detected.

11. The interface circuit of claim 10, wherein the data strobe signal is realigned so that edges of the recognized data strobe signal are substantially centered on the availability output data of the memory device.

* * * * *